(12) United States Patent
Deng

(10) Patent No.: US 9,400,299 B2
(45) Date of Patent: Jul. 26, 2016

(54) SINGLE LAYER TWO-DIMENSIONAL TOUCH SENSOR AND TOUCH CONTROL TERMINAL

(71) Applicant: SHENZHEN HUIDING TECHNOLOGY CO., LTD., Shenzhen, Guangdong (CN)

(72) Inventor: Gengchun Deng, Guangdong (CN)

(73) Assignee: SHENZHEN HUIDING TECHNOLOGY CO., LTD., Shenzhen (CN)

( * ) Notice: Subject to any disclaimer, the term of this patent is extended or adjusted under 35 U.S.C. 154(b) by 359 days.

(21) Appl. No.: 13/802,776

(22) Filed: Mar. 14, 2013

(65) Prior Publication Data

US 2013/0234739 A1    Sep. 12, 2013

Related U.S. Application Data

(63) Continuation of application No. PCT/CN2012/081561, filed on Sep. 18, 2012.

(30) Foreign Application Priority Data

Mar. 7, 2012 (CN) ...................... 2012 2 0103621 U

(51) Int. Cl.
*G01R 27/26* (2006.01)
*G06F 3/044* (2006.01)
(52) U.S. Cl.
CPC ............ *G01R 27/2605* (2013.01); *G06F 3/044* (2013.01); *G06F 2203/04104* (2013.01)
(58) Field of Classification Search
CPC ................... G06F 3/044; G06F 3/047; G06F 2203/04112; G06F 2203/04111; G06F 2203/04104; G01R 27/2605

USPC ........... 345/173, 174; 324/658, 661, 686, 687
See application file for complete search history.

(56) References Cited

U.S. PATENT DOCUMENTS

| | | | |
|---|---|---|---|
| 4,771,138 A * | 9/1988 | Dhawan .................. | G06F 3/044 178/18.03 |
| 2009/0219257 A1* | 9/2009 | Frey et al. ...................... | 345/173 |
| 2009/0315854 A1* | 12/2009 | Matsuo ......................... | 345/174 |
| 2010/0085326 A1* | 4/2010 | Anno ............................. | 345/174 |
| 2010/0289774 A1* | 11/2010 | Pan .......................... | G06F 3/044 345/175 |
| 2011/0018557 A1* | 1/2011 | Badaye ......................... | 324/658 |
| 2011/0102361 A1* | 5/2011 | Philipp ........................ | 345/174 |
| 2011/0227858 A1* | 9/2011 | An et al. ...................... | 345/173 |
| 2012/0062250 A1* | 3/2012 | Kuo ............................. | 324/686 |
| 2012/0105081 A1* | 5/2012 | Shaikh et al. ................. | 324/686 |
| 2013/0154995 A1* | 6/2013 | Trend ...................... | G06F 3/044 345/174 |

* cited by examiner

*Primary Examiner* — Tung X Nguyen
*Assistant Examiner* — Neel Shah

(57) ABSTRACT

A single-layer two-dimensional touch sensor includes a substrate and a flexible printed circuit board. First and second electrodes forming capacitor structures are disposed on the substrate. The first electrodes are arranged in a first direction. A group of second electrodes is disposed between each two adjacent first electrodes. The second electrodes are arranged in a head-to-tail meshed fashion in a second direction perpendicular to the first direction. In each group of second electrodes, lead lines of all second electrodes directly lead out to the flexible printed circuit board, and lead lines of the second electrodes at the same place in different group are short-connected at a node on the flexible printed circuit board. This touch sensor is a mutual capacitance structure which supports multi-point detection and increases the detection accuracy. In addition, no jumper wire is required on the substrate, which reduces the requirements of the fabrication process.

8 Claims, 7 Drawing Sheets

D1   D2   D3   D2   D1

SINGLE LAYER TWO-DIMENSIONAL TOUCH SENSOR AND TOUCH CONTROL TERMINAL

CROSS-REFERENCE TO RELATED APPLICATIONS

This present application is a Continuation Application of PCT application No. PCT/CN2012/081561 filed on Sep. 18, 2012, which claims the benefit of Chinese Patent Application No. 201220103621.9 filed on Mar. 7, 2012; the contents of which are hereby incorporated by reference.

FIELD

The present invention relates to touch control technology and, more particularly, to a single-layer two-dimensional touch sensor and a touch control terminal.

BACKGROUND

Conventional touch panels generally require multiple layers of conductive material structures (e.g. ITO). Although some touch panels may use a single layer ITO, jumpers wires are required at cross points of X-direction and Y-direction to form a network with X and Y dimensions. As shown in FIG. 1, the sensor 100 includes a substrate 110. A plurality of rows of driving electrode units 120 and a plurality of columns of induction electrode unit 130 are disposed on the substrate 110. Each row of the driving electrode units 120 includes a plurality of driving electrode 122. Adjacent driving electrodes 122 are connected by connecting wires 124. Each column of the induction electrode units 130 includes a plurality of induction electrodes 132. Adjacent induction electrodes 122 are connected by jumper wires 134. The jumper wires 134 are disposed above the connecting wires 124. The driving electrode units 122 and the induction electrode units 130 lead out through lead lines 140 and are then bonded with the flexible printed circuit board. In forming the jumper wires, insulation layers are required to be first formed at locations of the connecting wires 124 and then the jumper wires 134 of electrically conductive material are then disposed on the insulation layers. An enlarged view of the jumper wire 134 is shown in FIG. 1 by the G portion. This layout is very complicated which requires a high manufacturing accuracy.

Some touch sensors use a single-layer conductive material structure and do not need jumper wires. As shown in FIG. 2, such touch sensors include left side seven touch sensing areas Y00-Y07 and right side seven touch sensing areas Y10-Y17. However, each touch sensing area corresponds to a detection channel but not supports a mutual capacitance detection manner, which makes it impossible to achieve real multi-point detection due to constraints of the number of the detection channels.

SUMMARY

Accordingly, the present invention is directed to a single-layer two-dimensional touch sensor which can address the layout issue of the single-layer structure by using a mutual capacitance detection design.

The present invention provides a single-layer two-dimensional touch sensor including a substrate and a flexible printed circuit board. A plurality of first electrodes and a plurality of second electrodes are disposed on the substrate. The first electrodes and the second electrodes form capacitor structures. The plurality of first electrodes is arranged in a first direction. A group of second electrodes is disposed between each two adjacent first electrodes. The second electrodes are arranged in a second direction which is perpendicular to the first direction. Each second electrode is provided with a toothed structure extending along the second direction, the toothed structure of one second electrode is meshed with the toothed structure of the adjacent second electrode. A gap is formed at a meshing location of the second electrodes. In each group of second electrodes, lead lines of all second electrodes directly lead out to the flexible printed circuit board, and lead lines of the second electrodes at the same place in different group are short-connected at a node on the flexible printed circuit board.

In one embodiment, a gap between adjacent two first electrodes is not greater than 10 mm.

In one embodiment, the lead lines of each group of second electrodes are parallel to the first electrodes and are disposed between two corresponding first electrodes.

In one embodiment, in each group of second electrodes, the lead lines of the second electrodes at intermediate positions are not adjacent the first electrodes and pass through a nearest one of the second electrodes at ends of the substrate to lead out.

In one embodiment, each second electrode is provided with a toothed structure at its meshing portion, and a distance between the toothed structures at opposite ends of the same second electrode is not greater than 5 mm.

In one embodiment, the distance ranges between 1 mm to 3 mm.

In one embodiment, each second electrode is provided with a toothed structure at its meshing portion, and a distance between teeth of the toothed structure at their tooth roots is within 1 mm to 3 mm.

In one embodiment, areas of two adjacent second electrodes at the meshing location are equal to each other.

In one embodiment, the first electrodes are rectangular in shape.

In one embodiment, bonding points of the flexible printed circuit board are arranged in the first direction.

In one embodiment, a length of the single-layer two-dimensional touch sensor in the first direction is less than a length in the second direction, and the number of the first electrodes is greater than the number of the second electrodes in each group.

The present invention further provides a touch control terminal including a touch sensor. The touch sensor is the single-layer two-dimensional touch sensor as described above.

The above described single-layer two-dimensional touch sensor is a mutual capacitance structure which supports multi-point detection and increases the detection accuracy. In addition, no jumper wire is required on the substrate. The electrodes, which would need jumper wires in conventional sensors, directly lead out and are short-connected on the flexible printed, thus simplifying the layout and reducing the requirements of the fabrication process.

Other independent aspects of the invention will become apparent by consideration of the detailed description, claims and accompanying drawings.

DESCRIPTION OF THE EMBODIMENTS

Before any independent embodiments of the invention are explained in detail, it is to be understood that the invention is not limited in its application to the details of construction and the arrangement of components set forth in the following description or illustrated in the following drawings. The invention is capable of other independent embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Further, it is to be understood that such terms as "forward", "rearward", "left", "right", "upward" and "downward", etc., are words of convenience and are not to be construed as limiting terms.

A single-layer two-dimensional touch sensor includes a substrate and a flexible printed circuit board. A plurality of first electrodes and a plurality of second electrodes are disposed on the substrate in two directions orthogonal to each other. The first electrodes and the second electrodes may form capacitor structures, with the first electrodes being driving electrodes and the second electrodes being induction electrodes, as long as one type electrodes of the driving electrodes and the induction electrodes be disposed in a horizontal direction and the other type electrodes be disposed on a perpendicular direction. Therefore, to simplify description, the two directions perpendicular to each other are defined as a first direction and a second direction in the following description.

Figure 3:
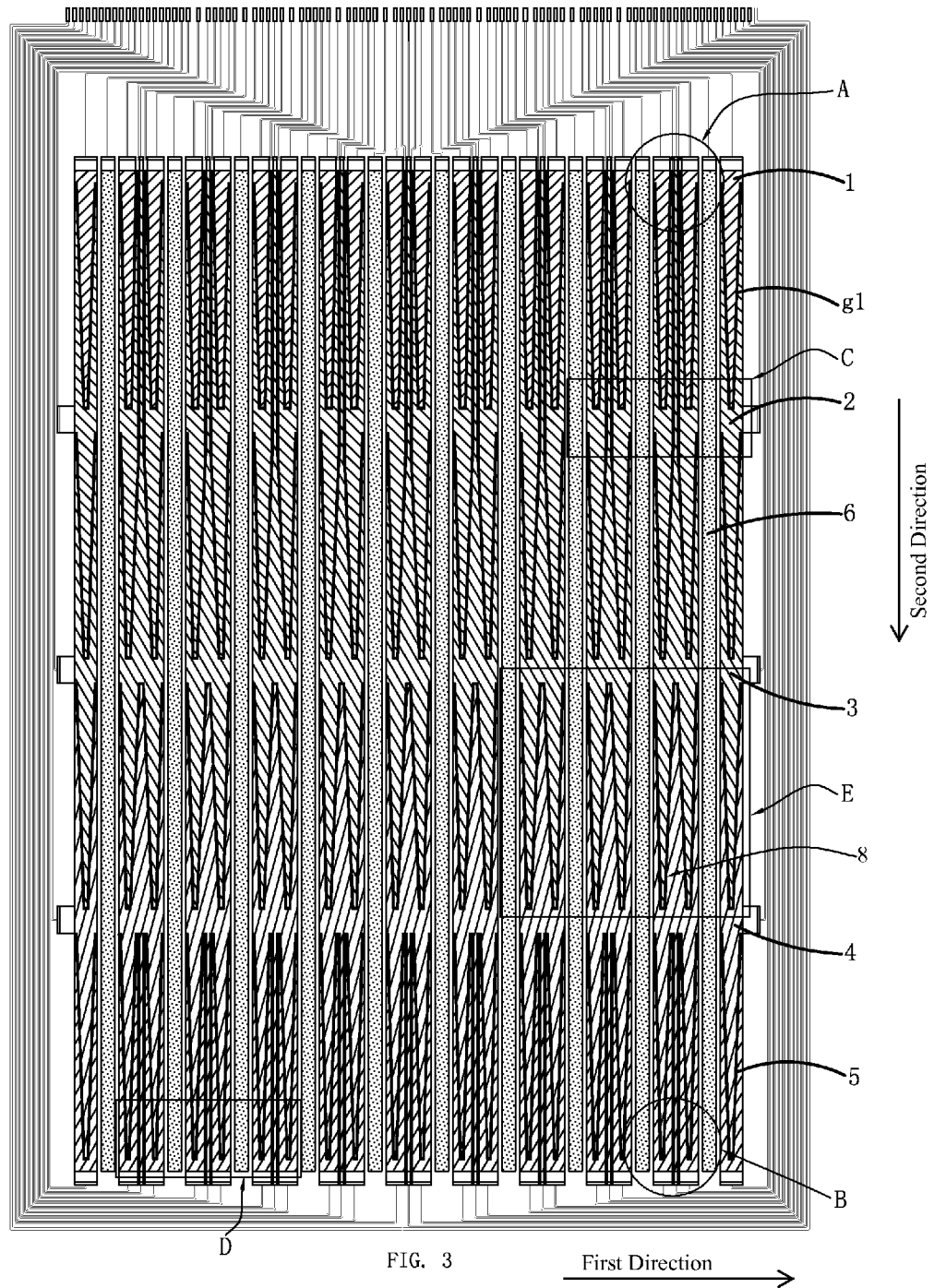
FIG. 3 illustrates a layout diagram of a single-layer two-dimensional touch sensor according to one embodiment of the present invention.

Referring to FIG. 3, a plurality of first electrodes 6 is arranged in parallel in the first direction. In FIG. 3, the first electrodes 6 are illustrated as being rectangular in shape. A group of second electrodes is arranged between each two adjacent first electrodes 6 in the second direction. The second electrodes are meshed with each other, with a gap g1 formed at a meshing location of the second electrodes. In FIG. 3, a total of five second electrodes, referenced 1-5, are illustrated, which are differentiated by hatching in different directions and at different angles. In each group of the second electrodes, in order to avoid the jumper wires, lead lines of all the second electrodes directly lead to the flexible printed circuit board. The lead lines of those second electrodes at the same place in different group (i.e. the second electrodes 1 in each group, the second electrodes 2 in each group . . . , the second electrodes 5 in each group) are short-connected at a node on the flexible printed circuit board. Bonding points of the flexible printed circuit board are arranged along the first direction. When a user touches a touch area, the touch location can be determined according to a ratio between detecting data values of the electrodes. Dense lines at a periphery of FIG. 3 are electrode lead lines.

In addition, in order to ensure that a touch by a user's finger or a stylus can affect two or more first electrodes along the first direction, a gap between adjacent first electrodes is not greater than 10 mm.

Figure 4:
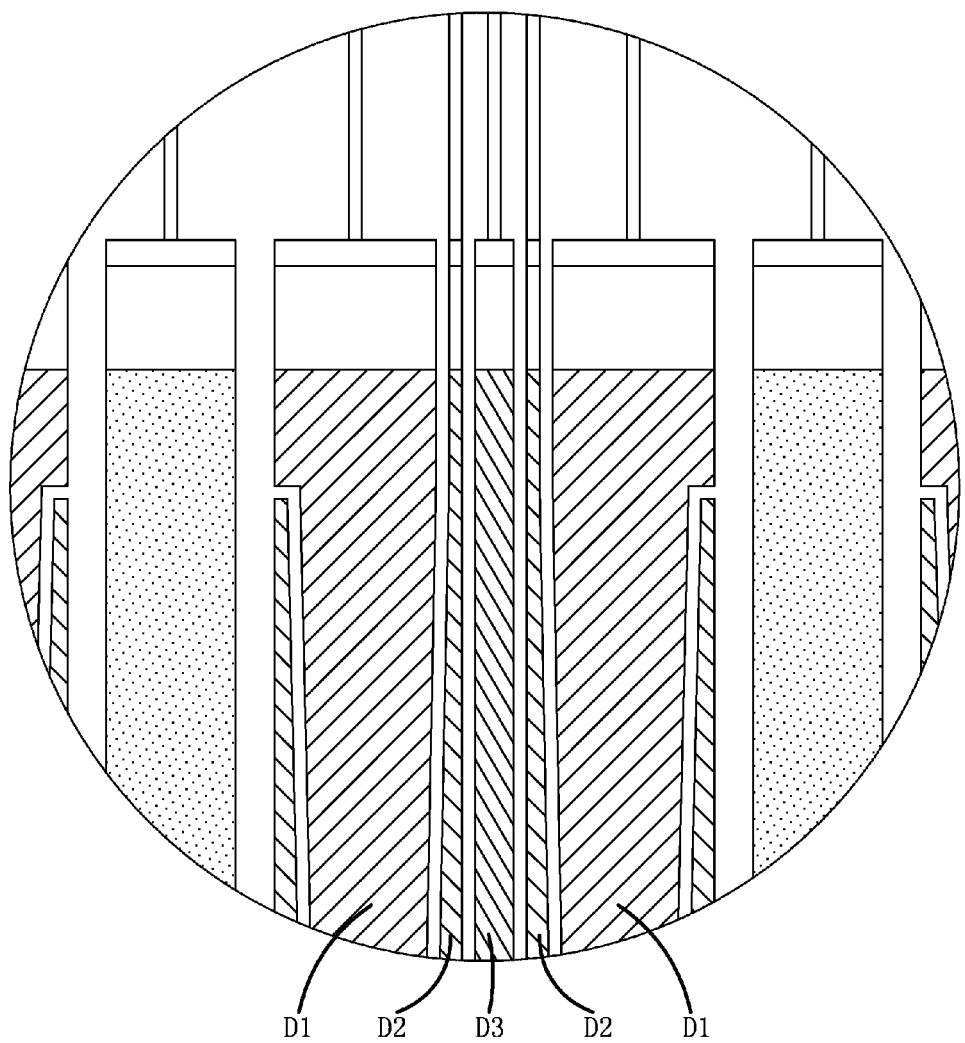
FIGS. 4-8 are enlarged views of portions A-E of FIG. 3.
Figure 5:
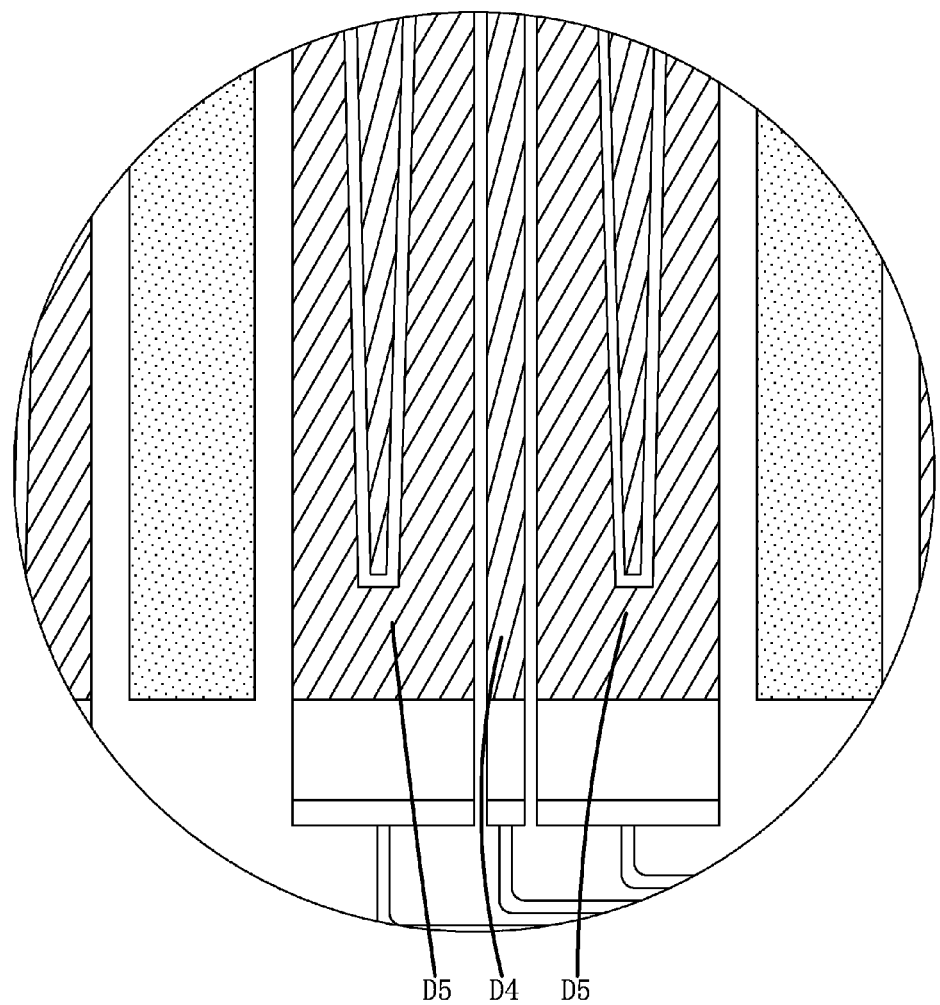

The lead line of each second electrode is parallel to the first electrodes 6 and positioned between two adjacent first electrodes 6. In order to avoid an unduly large static capacitance, except for the second electrodes 1 and 5 located at opposite ends, the lead lines of the intermediate electrodes 2, 3, 4 are not adjacent the first electrodes 6, and pass through the nearest one of the second electrodes 1 and 5 at the opposite ends and lead out. FIG. 4 is an enlarged view of the portion A of FIG. 3, which shows that the lead lines D2 and D3 of the second electrodes 2 and 3 pass through the second electrode 1 and lead out. FIG. 5 is an enlarged view of the portion B of FIG. 3, which shows that the lead line D4 of the electrode 4 passes through the second electrode 5 and leads out.

Figure 1:
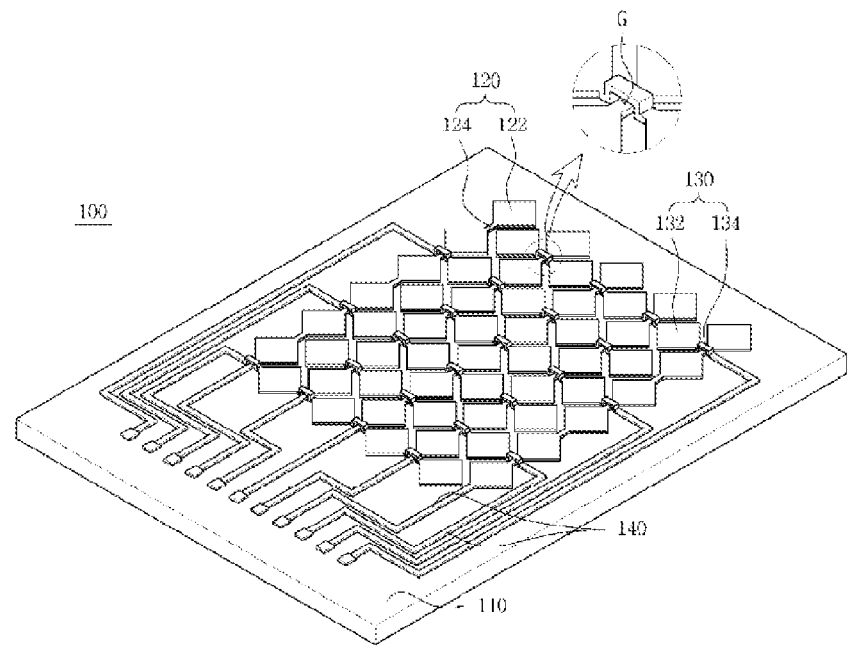
FIG. 1 illustrates a layout diagram of a conventional single-layer two-dimensional touch sensor using jumper wires.
Figure 2:
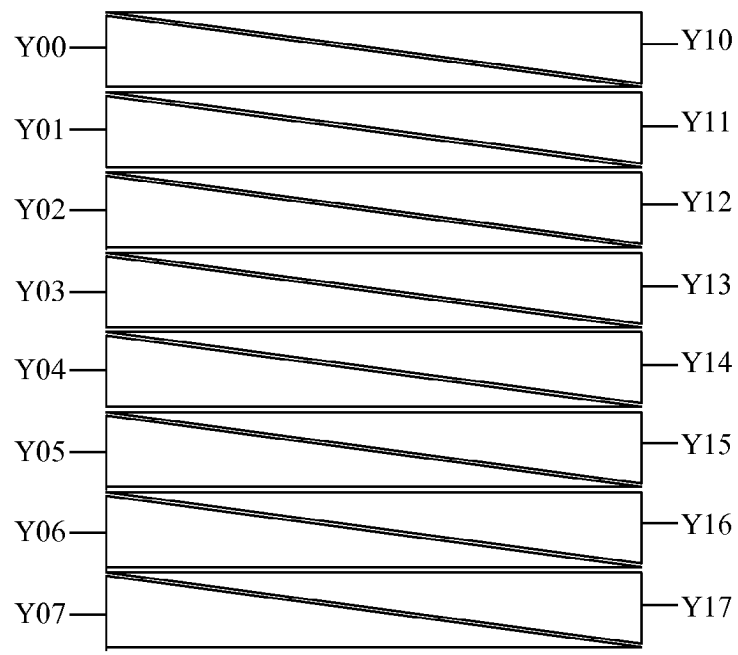
FIG. 2 illustrates layout diagram of a conventional single-layer two-dimensional touch sensor that does not support mutual capacitance detection.
Figure 6:
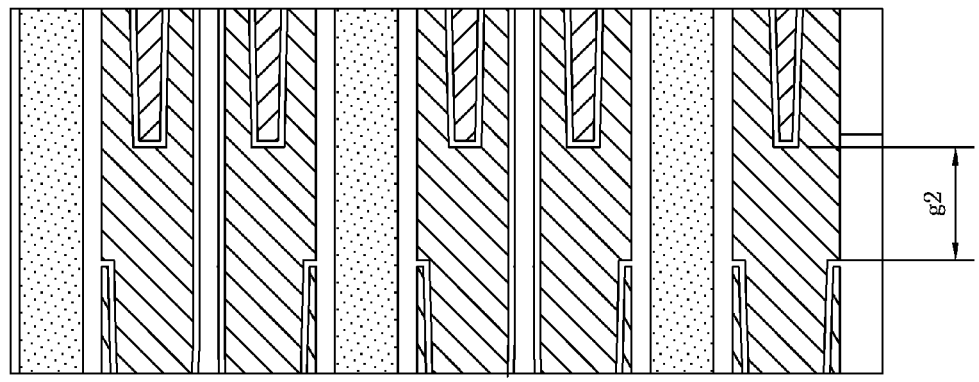

As shown in FIG. 1, each second electrode is provided with a toothed structure 8 at its meshing portion. In order to ensure that a touch operation can affect two or more electrodes along the second direction, as shown in FIG. 6 which is an enlarged view of the portion C of FIG. 3, in each group of second electrodes, a distance g2 between the toothed structures 8 at opposite ends of the same second electrode is not greater than 5 mm, preferably, 1 mm to 3 mm.

Figure 7:
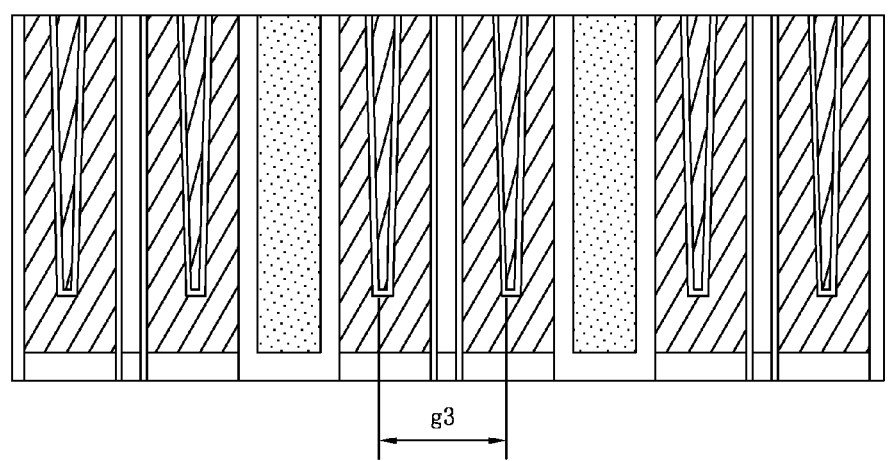

FIG. 7 is an enlarged view of the portion D of FIG. 3. A distance g3 between teeth of the toothed structure 8 at their tooth roots is within 1 mm to 3 mm to ensure that when a user's finger sweeps leftward or rightward, the area of the second electrodes covered by the user's finger can change smoothly.

Figure 8:
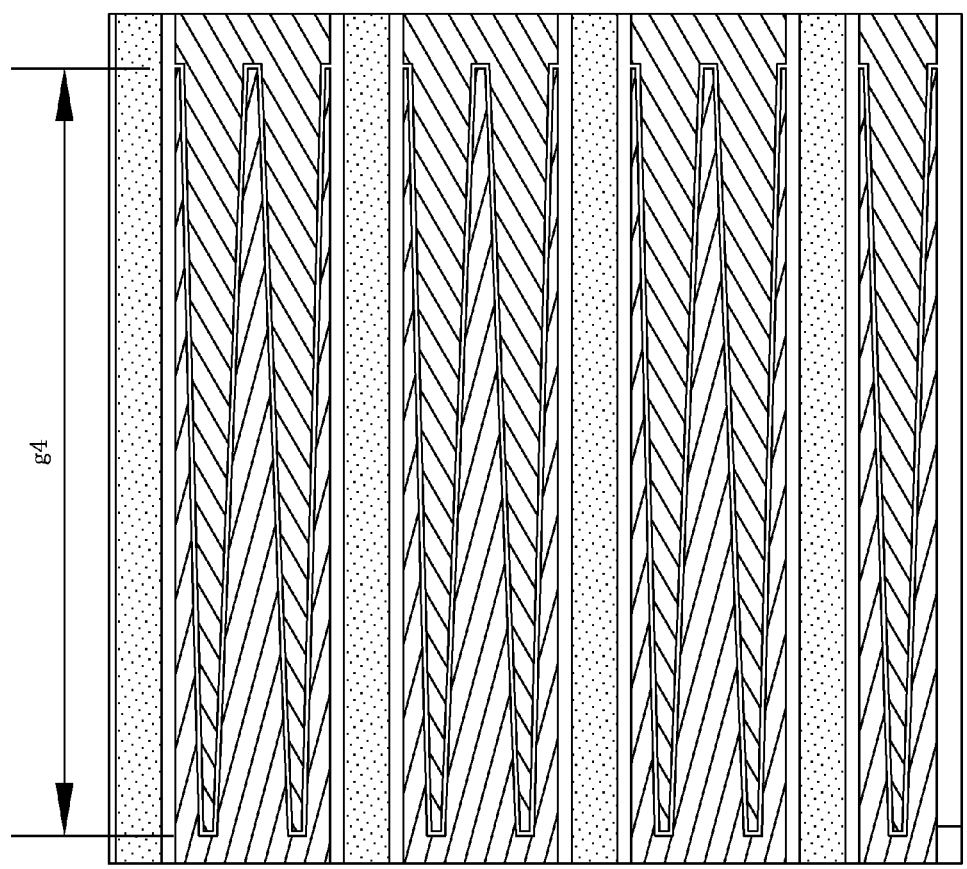

In design, in order for adjacent second electrodes to achieve complementary and symmetrical detecting data to thereby enable software to correctly calculate coordinates of the touch point, areas of two adjacent second electrodes at the meshing location are required to be equal or approximately equal. Referring to FIG. 8 which is an enlarged view of the portion E of FIG. 3, at the meshing location g4, the areas of two second electrodes are equal or approximately equal.

In a conventional solution, allocation of the electrodes in X and Y directions is generally based on the physical size of the screen such that the long side is allocated with more electrodes while the short side is allocated with less electrodes. This solution can be easily realized when a multilayer ITO structure is utilized. However, when a single-layer structure is utilized, this solution can cause the number of lead lines on both sides to increase significantly and therefore become generally infeasible for handheld devices with a slim bezel.

The single-layer two-dimensional touch sensor may be used in various touch control terminals. For handheld devices with a slim bezel, i.e. the length in the first direction of the single-layer two-dimensional touch sensor is less than the length in the second direction, the number of the first electrodes 6 is greater than the number of the second electrodes in each group. As shown in FIG. 1, in the present design, the allocation of the electrodes in the two directions is based on the bonding location of the flexible printed circuit. The first electrodes are distributed in a higher density (at an interval of about 5 mm) at the bonding end of the flexible printed circuit board, and the first electrodes can lead out from the visible screen area and then directly connects to the bonding area. A smaller number of the second electrodes are allocated to the other dimension to reduce the difficulties with the lead lines. In addition, the second electrodes are meshed with each other.

Figure 9:
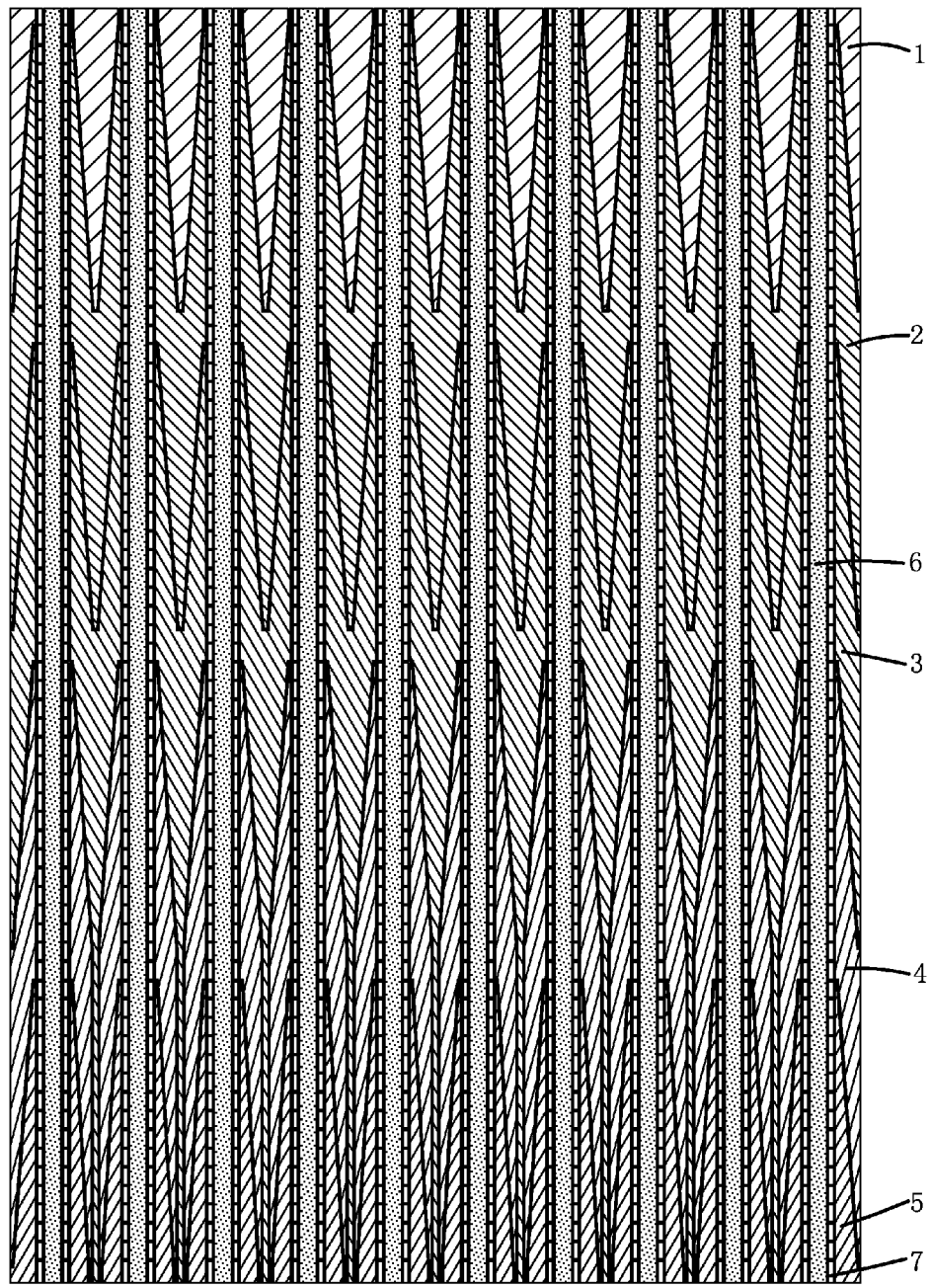
FIG. 9 illustrates a layout diagram of a single-layer two-dimensional touch sensor according to another embodiment of the present invention.

While the second electrodes are illustrated as being W shaped in FIGS. 3 to 8, the second electrodes can also be of another shape in other embodiments. For example, as shown in FIG. 9, the second electrodes can be V-shaped. The second electrodes 1-5 are arranged in the second direction in a head-to-tail meshed fashion, and the first electrodes 6 are arranged in parallel in the first direction.

In addition, in FIG. 9, a filler 7 of electrically conductive material can be disposed between the first electrodes and the second electrodes to ensure that the entire touch screen has a uniform light transmission rate. It is to be understood that the filler 7 may also be included in the touch sensor of FIG. 3.

It will be apparent to those skilled in the art that various modifications and variations can be made to the disclosed structure without departing from the scope or spirit of the invention. In view of the foregoing, it is intended that the present invention cover modifications and variations of this invention provided they fall within the scope of the following claims and their equivalents.

What is claimed is:

1. A single-layer two-dimensional touch sensor comprising a substrate and a flexible printed circuit board, wherein a plurality of first electrodes and a plurality of second electrodes are disposed on the substrate, the first electrodes and the second electrodes form capacitor structures, the plurality of first electrodes is arranged in parallel and disposed along a first direction, a group of second electrodes is disposed between each two adjacent first electrodes without directly contacting with the first electrodes, the second electrodes in the group are arranged along a second direction which is perpendicular to the first direction; the first electrodes are spaced from the second electrodes, and a filler of electrically conductive material is disposed between the first electrodes and the second electrodes, each second electrode is provided with a toothed structure extending along the second direction, the toothed structure of one second electrode is meshed with the toothed structure of the adjacent second electrode, such that lead lines of all second electrodes are capable of being directly led out to the flexible printed circuit board, in each group of second electrodes, the lead lines of the second electrodes at intermediate positions are not adjacent the first electrodes, wherein a gap between adjacent two first electrodes is not greater than 10 mm.

2. The single-layer two-dimensional touch sensor according to claim 1, wherein a distance between the toothed structures at opposite ends of the same second electrode is not greater than 5 mm.

3. The single-layer two-dimensional touch sensor according to claim 2, wherein the distance ranges between 1 mm to 3 mm.

4. The single-layer two-dimensional touch sensor according to claim 1, wherein a distance between teeth of the toothed structure at their tooth roots is within 1 mm to 3 mm.

5. The single-layer two-dimensional touch sensor according to claim 1, wherein areas of the toothed structure of two adjacent second electrodes are equal to each other.

6. The single-layer two-dimensional touch sensor according to claim 1, wherein the first electrodes are rectangular in shape.

7. The single-layer two-dimensional touch sensor according to claim 1, wherein a length of the single-layer two-dimensional touch sensor in the first direction is less than a length in the second direction, and the number of the first electrodes is greater than the number of the second electrodes in each group.

8. A touch control terminal comprising a touch sensor, wherein the touch sensor is a single-layer two-dimensional touch sensor according to claim 1.

* * * * *